United States Patent
Chong et al.

(10) Patent No.: US 10,222,418 B2
(45) Date of Patent: Mar. 5, 2019

(54) SCAN CELL FOR DUAL PORT MEMORY APPLICATIONS

(71) Applicant: ARM Limited, Cambridge (GB)

(72) Inventors: Yew Keong Chong, Austin, TX (US); Teresa Louise Mclaurin, Dripping Springs, TX (US); Richard Slobodnik, Austin, TX (US); Frank David Frederick, Austin, TX (US); Kartikey Jani, Bengaluru (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/368,480

(22) Filed: Dec. 2, 2016

(65) Prior Publication Data

US 2018/0156866 A1    Jun. 7, 2018

(51) Int. Cl.
*G01R 31/317* (2006.01)
*G01R 31/3177* (2006.01)
*G01R 31/3185* (2006.01)
*G11C 29/32* (2006.01)

(52) U.S. Cl.
CPC ... *G01R 31/3177* (2013.01); *G01R 31/31723* (2013.01); *G01R 31/31725* (2013.01); *G01R 31/318536* (2013.01); *G01R 31/318541* (2013.01); *G01R 31/318544* (2013.01); *G01R 31/318583* (2013.01); *G11C 2029/3202* (2013.01)

(58) Field of Classification Search
CPC .......... G01R 31/3177; G01R 31/31725; G01R 31/31723; G01R 31/318541; G01R 31/318536; G01R 31/318583; G01R 31/318544; G11C 2029/3202
USPC ........................................................ 714/726
See application file for complete search history.

(56) References Cited

U.S. PATENT DOCUMENTS

| | | | | |
|---|---|---|---|---|
| 6,937,493 | B2 * | 8/2005 | Krause | G11C 16/102 365/189.02 |
| 7,155,647 | B2 * | 12/2006 | Smith | G01R 31/318563 714/726 |
| 7,375,549 | B1 * | 5/2008 | Tang | H03K 19/17744 326/38 |
| 7,665,001 | B2 * | 2/2010 | Baik | G01R 31/318541 714/726 |
| 8,489,947 | B2 * | 7/2013 | Sunter | G01R 31/3177 324/76.54 |
| 2004/0030973 | A1 * | 2/2004 | Chan | G01R 31/318541 714/724 |

(Continued)

*Primary Examiner* — James C Kerveros
(74) *Attorney, Agent, or Firm* — Pramudji Law Group PLLC; Ari Pramudji

(57) ABSTRACT

Various implementations described herein are directed to a scan cell. The scan cell may include an input phase having multiple multiplexers and a latch arranged to receive a scan input signal, a first address signal, and a second address signal and provide the scan input signal, the first address signal, or the second address signal based on a scan enable signal, a first clock signal, and a selection enable signal. The scan cell may include an output phase having multiple latches arranged to receive the scan input signal, the first address signal, or the second address signal from the input phase and provide the scan input signal, the first address signal, or the second address signal as a scan output signal based on a second clock signal and a third clock signal.

18 Claims, 7 Drawing Sheets

(56) References Cited

U.S. PATENT DOCUMENTS

| | | | |
|---|---|---|---|
| 2005/0091561 A1* | 4/2005 | Lee | G01B 31/318536 714/718 |
| 2007/0061644 A1* | 3/2007 | Birmiwal | G01R 31/318583 714/726 |
| 2009/0172486 A1* | 7/2009 | Ross et al. | G11C 29/1201 714/729 |
| 2011/0022908 A1* | 1/2011 | Wang | G01R 31/31816 714/726 |
| 2013/0275824 A1* | 10/2013 | Tekumalla | G01R 31/318536 714/726 |
| 2015/0143190 A1 | 5/2015 | McLaurin | |
| 2016/0064054 A1 | 3/2016 | Chen et al. | |

\* cited by examiner

SCAN CELL FOR DUAL PORT MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit design, scan cell chains and related mechanisms are used for testing an integrated circuit (IC) by providing a means for observing flip-flop output. In full scan design, automatic test pattern generation (ATPG) provides for simpler application of combinatorial testing. In some current memory macro designs, embedded scan chains may not be present on address pins and control pins.

For ATPG coverage on these pins, there are some techniques that may be used on a system-on-chip (SoC) level. One example technique may generate random access memory (RAM) based sequential ATPG patterns. This technique may have a downside in run time for an ATPG tool to generate patterns as well as an increase in ATPG pattern count, which may result in increased test time and testing cost. Another technique may add observation scan cells on drivers of input pins of the memory macro. Unfortunately, this technique may result in additional hardware cost on the SoC level.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for implementing a scan cell in dual port memory applications. For instance, various implementations described herein refer to a circuit scheme and/or technique to provide full scan in a memory macro with pseudo dual ports and a capability for achieving full test coverage of shadow logic coupled to both ports of a pseudo dual port memory. Static and dynamic faults may be supported by exercising actual paths inside a memory macro to provide lower hardware costs on the SoC level. In some instances, the schemes and techniques described herein may introduce scan chains on address and control pins of the memory macro to avoid downsides of certain alternative techniques taken in modern designs. Pseudo dual port (double pump) memories may have two ports (dual port) for memory operations controlled by a single clock. Each input in some designs may have a latch controlled by a secondary clock that is derived from an external clock, and full scan chains may be added by introducing one or more latches within the circuitry.

Various implementations described herein provide for a double pump scan cell design having unique circuit characteristics that use an innovative scan technique for scan observation. With custom timing pulses and data usage models, there is not a standard ATPG test solution for scan that minimize latch counts or matched actual timing by re-using actual internal timing pulses. The various schemes and/or techniques described herein address these issues by defining a circuit to address ATPG test needs with minimal design impact and added logic. Further, an embedded scan control register is added to result in a simpler user/designer experience.

Accordingly, various implementations for implementing a scan cell in dual port memory applications will now be described with reference to FIGS. 1-5.

Figure 1:
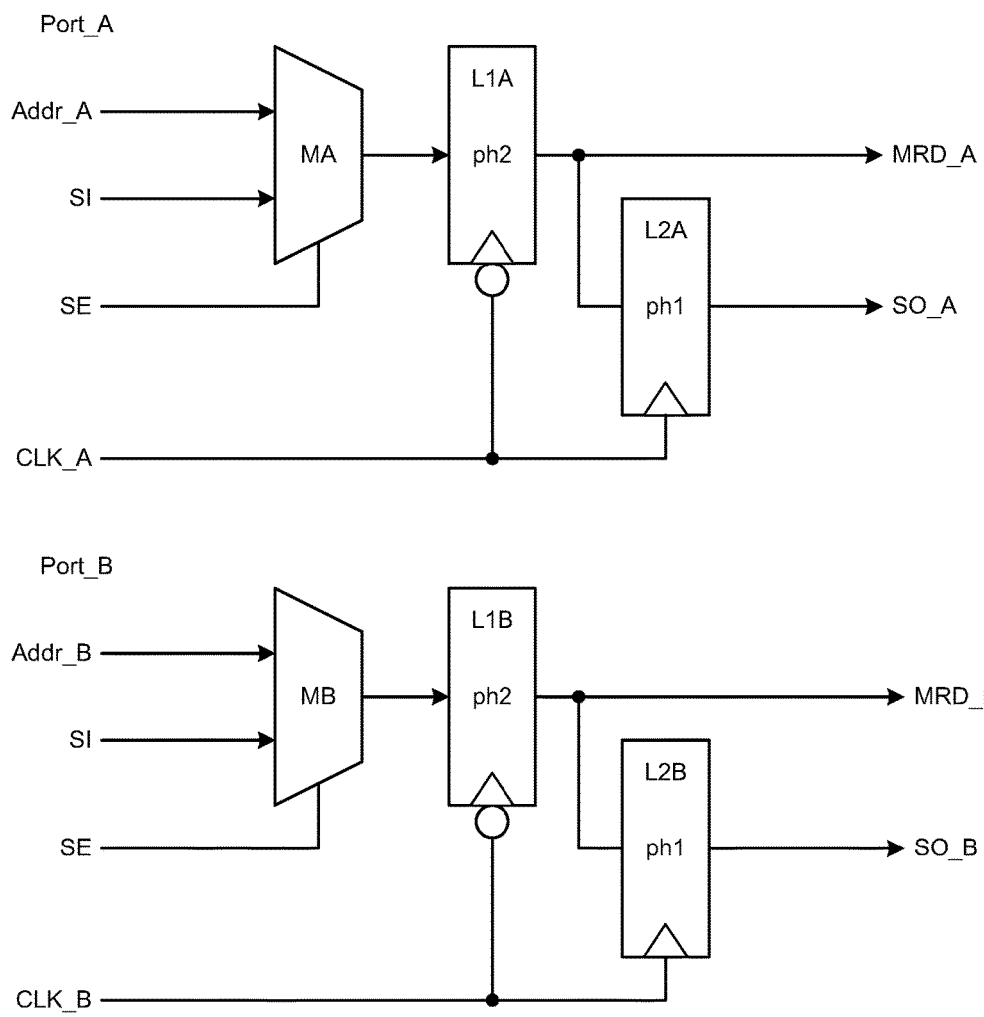
FIG. 1 illustrates a diagram of dual port memory circuitry in accordance with implementations described herein.

FIG. 1 illustrates a diagram of dual port memory circuitry 100 in accordance with implementations described herein. The memory circuitry 100 may be implemented as an integrated circuit (IC) in utilizing various types of memory, such as, e.g., random access memory (RAM), and/or any other types of memory, including any type of volatile and non-volatile memory. The memory circuitry 100 may be implemented as an IC with dual rail memory architecture. The memory circuitry 100 may be integrated with various types of computing circuitry and/or various related components on a single chip. Alternatively, the memory circuitry 100 may be implemented in an embedded system for various electronic and mobile applications.

As shown in FIG. 1, the circuitry 100 may include a dual port memory macro for a first port (Port_A) and second port (Port_B). The first port (Port_A) may include a multiplexer MA, a first latch L1A, and a second latch L2A arranged to receive a first address (Addr_A) signal, a signal input (SI) signal, and a scan enable (SE) signal. The first multiplexer MA may receive the first address (Addr_A) signal and the signal input (SI). The first multiplexer MA may provide the first address (Addr_A) signal or the signal input (SI) to the first latch L1A based on the scan enable (SE) signal. The first latch L1A may receive and provide the first address (Addr_A) signal or the signal input (SI) to the second latch L2A based on the first clock (CLK_A) signal. Further, the second latch L1B may receive and provide the first address (Addr_A) signal or the signal input (SI) as a signal output (SO) based on the first clock (CLK_A) signal. In some cases, the output signals of the first latch L1A may be used for first memory row decoders (MRD_A).

Similarly, the second port (Port_B) may include a multiplexer MB, a first latch L1B, and a second latch L2B arranged to receive a second address (Addr_B) signal, a signal input (SI) signal, and a scan enable (SE) signal. The second multiplexer MB may receive the second address (Addr_B) signal and the signal input (SI). The second multiplexer MB may provide the second address (Addr_B) signal or the signal input (SI) to the first latch L1B based on the scan enable (SE) signal. The first latch L1B may receive and provide the second address (Addr_B) signal or the signal input (SI) to the second latch L2B based on the second clock (CLK_B) signal. Further, the second latch L2B may receive and provide the second address (Addr_B) signal or the signal input (SI) as a signal output (SO) based on the second clock (CLK_B) signal. In some cases, the output signals of the first latch L1B may be used for second memory row decoders (MRD_B).

In some implementations, a basic scan cell may comprise a D-flip-flop (DFF) that may incorporate a scan multiplexer (MUX). Generally, the DFF is a positive edge (posedge) triggered storage device. Internally, some DFF may be provided with a ph2 D-latch (e.g., latch is open, when the clock is low) and a ph1 D-latch (e.g., latch is open, when the clock is high). The output Q of the DFF may serve as the scan output (SO) signal. As shown in FIG. 1, each port (Port_A, Port_B) may be configured as a MUX-DFF scan cell having a multiplexer (mux), a ph2 D-latch, and a ph1 D-latch.

In reference to capturing an address input in RAM macros, a simple memory may be described to process a single transaction with each rise edge of a clock. For instance, to capture an address input during scan based testing, the ph1 latch may be added to the existing data paths (MRD_A, MRD_B), as shown in FIG. 1. The ph2 latch may be a functional latch that holds an address value while bitcells in the data paths are processed (i.e., memory bitcell transactions are initiated when clock is high). The ph1 latch may be added for DFT_OC to provide an effective scan DFF for addressing. In this instance, each of the port cells (Port_A, Port_B) in FIG. 1 may be referred to as a RAM address observe cell.

In reference to capturing an address input in dual port RAM macros, as shown in FIG. 1, the dual ported memory (Port_A, Port_B) differs in that it has two unique ports capable of performing operations. For scan observation, there is simply two scan observe cells (Port_A, Port_B) for each address port/clock (CLK_A, CLK_B). Thus, each different port (Port_A, Port_B) may be considered its own separate entity.

Dual ported memory may have some drawbacks, such as, e.g., having double the number of rows/wordlines, sense amplifiers, etc., which may lead to slower access times and more area. Current design technology may allow for transactions to occur off of a single shared clock. However, various implementations provided herein may utilize two separate asynchronous clocks. To accomplish this, the memory may receive two sets of inputs, and the memory should manage and execute transactions one at a time. This may be accomplished with the circuit and timing diagram of FIG. 2 as provided herein below. In this instance of FIG. 2, the input clock may generate two internal transaction events by generating two internal GTP clocks. The circuit may select Addr_A for its first operation followed by Addr_B. This may be controlled by a mux_sel signal.

Figure 2:
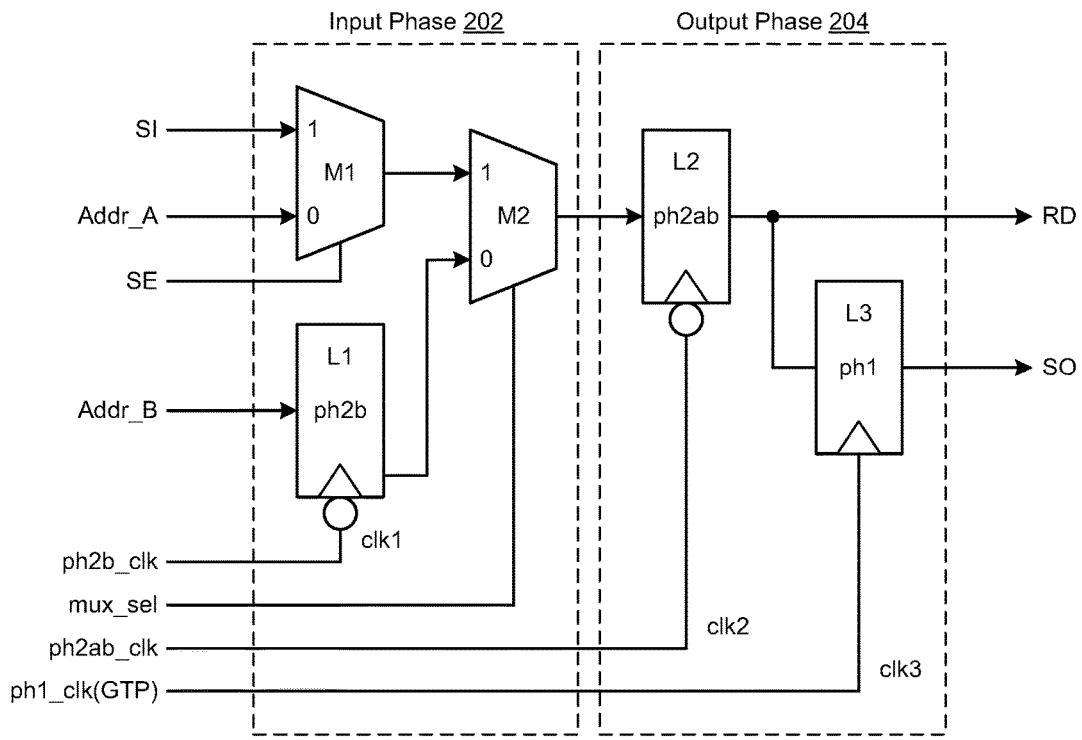
FIG. 2 illustrates a diagram of double pump memory circuitry in accordance with implementations described herein.
Figure 2:
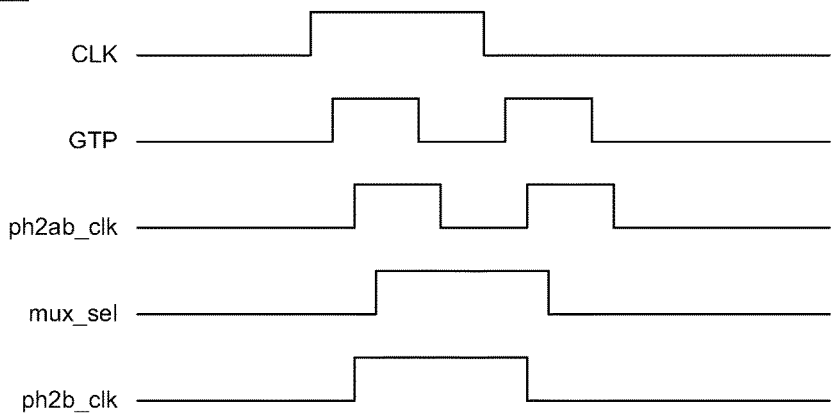

FIG. 2 illustrates a schematic diagram of double pump circuitry 200 in accordance with implementations described herein.

The circuitry 200 may be implemented as an integrated circuit (IC) when utilized in various types of memory applications, such as, e.g., a scan cell for random access memory (RAM), and/or any other types of memory, including any type of volatile and non-volatile memory. The circuitry 200 may be implemented as an IC with dual rail memory architecture, such as, e.g., dual port memory architecture. Further, the circuitry 200 may be integrated with various types of computing circuitry and/or various related components on a single chip. Alternatively, the circuitry 200 may be implemented in an embedded system for various electronic and mobile applications.

As shown in FIG. 2, the circuitry 200 may include an input phase 202 having multiple multiplexers M1, M2 and a latch L1 arranged to receive a scan input (SI) signal, a first address (Addr_A) signal, and a second address (Addr_B) signal. The multiplexers M1, M2 and the latch L1 may be arranged to provide the scan input (SI) signal, the first address (Addr_A) signal, or the second address (Addr_B) signal based on a scan enable (SE) signal, a first clock (ph2$b$_clk) signal, and a selection enable (mux_sel) signal. The selection enable (mux_sel) signal may include a multiplexer selection control signal.

The multiple multiplexers M1, M2 may include a first multiplexer M1 and a second multiplexer M2. The first multiplexer M1 may receive the scan input (SI) signal and the first address (Addr_A) signal. The first multiplexer M1 may provide the scan input (SI) signal or the first address (Addr_A) signal to the second multiplexer M2 based on the scan enable (SE) signal. The latch L1 may include a first latch L1 that may receive the second address (Addr_B) signal and provide the second address (Addr_B) signal to the second multiplexer M2 based on the first clock (ph2$b$_clk) signal. Further, the second multiplexer M2 may receive the scan input (SI) signal or the first address (Addr_A) signal from the first multiplexer M1 and receive the second address (Addr_B) signal from the first latch L1. The second multiplexer M2 may provide the scan input (SI) signal, the first address (Addr_A) signal, or the second address (Addr_B) signal to the output phase 204 based on the selection enable signal. In some implementations, as shown in FIG. 2, the first latch L1 may be referred to as a ph2$b$ latch.

The first address (Addr_A) signal may reference a first port (Port_A) memory address from a dual port memory circuit, device, or component, and the second address (Addr_B) signal may reference a second port (Port_B) memory address from the dual port memory circuit, device, or component. The selection enable (mux_sel) signal may include an observe control signal (observe_control) that may be used during a scan capture mode of operation of the circuitry 200 (e.g., scan cell) to select the first port (Port_A) memory address or the second port (Port_B) memory address. In some implementations, the scan enable (SE) signal may be different than the selection enable (mux_sel) signal.

The circuitry 200 may include an output phase 204 having multiple latches L2, L3 arranged to receive the scan input (SI) signal, the first address (Addr_A) signal, or the second address (Addr_B) signal from the input phase 202. The multiple latches L2, L3 may be arranged to provide the scan input (SI) signal, the first address (Addr_A) signal, or the second address (Addr_B) signal as a scan output (SO) signal based on a second clock (ph2$ab$_clk) signal and a third clock (ph1_clk/GTP) signal. As shown in FIG. 2, the second latch L2 may be referred to as a ph2$ab$ latch, and the third latch L3 may be referred to as a ph1 latch. Further, the second clock (ph2$ab$_clk) signal may be different than the first (ph2$b$_clk) clock signal, and the third clock (ph1_clk/GTP) signal may be different than the first clock jph2$b$_clk) signal and the second clock (ph2$ab$_clk) signal. Further, in some cases, the output signals of the second latch L2 may be used for row decoding (RD) in memory applications.

The multiple latches L2, L3 may include a second latch L2 and a third latch L3. The second latch L2 may receive the scan input (SI) signal, the first address (Addr_A) signal, or the second address (Addr_B) signal from the second multiplexer M2. The second latch L2 may provide the scan input (SI) signal, the first address (Addr_A) signal, or the second address (Addr_B) signal to the third latch L3 based on the second clock (ph2ab_clk) signal. The third latch L3 may receive the scan input (SI) signal, the first address (Addr_A) signal, or the second address (Addr_B) signal from the second latch L2. The third latch L3 may provide the scan input (SI) signal, the first address (Addr_A) signal, or the second address (Addr_B) signal as the scan output (SO) signal based on the third clock (ph1_clk/GTP) signal.

In reference to FIG. 2, the first latch L1 (i.e., ph2b latch) may be controlled by the first clock (ph2b_clk) signal, the second latch L2 (i.e., ph2ab latch) may be controlled by the second clock (ph2ab_clk) signal, and the third latch L3 (i.e., ph1 latch) may be controlled by the third clock (ph1_clk/GTP) signal. FIG. 2 shows a timing diagram 210 in a functional mode with respect to an external clock CLK.

The input clock generates two internal transaction events by generating two internal GTP clocks. It then selects Addr_A for its operation followed by Addr_B. This may be controlled by the mux_sel signal. To support scan observability, the ph1 latch is added. To save area, the single ph1 latch is added to the circuit to complete a scan FF (ph2/ph1 pair). The ph1 latch may capture a last address port processed through the mux. The ph2b clock holds the Addr_B data until the second double pump operation is able to execute. The ph2 latches are open and pass data when the ph2 clock is low.

In a mission mode of operation, an input for the second address (Addr_B) signal may be selected at the end of a clock cycle. In a test mode of operation, the first clock (ph2b_clk) signal is shown in the timing diagram 210. The selection enable (mux_sel) signal (i.e., multiplexer control signal) may be generated using the following equation:

$$mux\_sel=functional\&!dftrambyp|(dftrambyp\&(SE|DFT\_OC))$$

In some cases, if the value of DFT_OC and DFTRAMBYP is 1, then ph2ab_clk may have a first pulse only. In other modes, ph2ab_clk may have a double pulse as shown in the timing diagram 210, which may be similar to the functional mode of operation. DFT_OC may be an internally generated signal using a scanable hold flop (D=Q). In various implementations, test in functional mode is accurate with respect to timing by the way the circuit is utilized.

Figure 3:
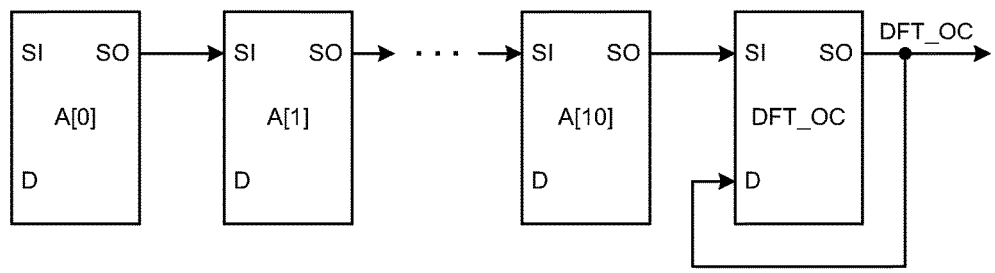
FIG. 3 illustrates a block diagram of an internal scan chain in accordance with implementations described herein.

FIG. 3 illustrates a block diagram of an internal scan chain 300 in accordance with implementations described herein. In some implementations, the internal scan chain 300 refers to an architectural diagram that may be used to generate the DFT_OC signal.

As shown in FIG. 3, the internal scan chain 300 may include a series control chain of D-flip-flops A[0], A[1], . . . , A[10] followed by an observe_control flop DFT_OC. Some advantages of internally generating the DFT_OC signal are gained by adding the scanable hold flop DFT_OC at an end of the internal (control) scan chain 300 in memory applications instead of through an external pin. For instance, full scan control of the DFT_OC signal from the ATPG tool may be achieved without use of an external pin. In another instance, the scanned value of DFT_OC may be held during scan capture, which allows at-speed transition testing to be performed without resulting in timing collisions between the DFT_OC signal and the double pump clock, which may allow no compromise of test coverage with either static or dynamic fault testing. Further, full coverage for address signals Addr_A and Addr_B and matching timing for both ports may be achieved, area reduction with only one L3 latch (i.e., ph1 latch) may be achieved, and no additional pin may be needed for a user to select input during scan capture.

The DFT_OC flop may be referred to as the observe_control flop. During a scan load/unload, a value selecting test of Addr_A or Addr_B is loaded. During a scan capture sequence, the value is held by assigning D=Q. As such, in some cases, the following equations may be applied:

$$mux\_sel=functional\&!dftrambyp|(dftrambyp\&(SE|observe\_control))$$

$$ph1\_clk=GTP\&(DFTRAMBYP?(SE|(obs\_control?op1\_enable:op2\_enable)):1'b1)$$

$$observe\_control=scanable\ hold\ flop(D=Q)$$

Figure 4A:
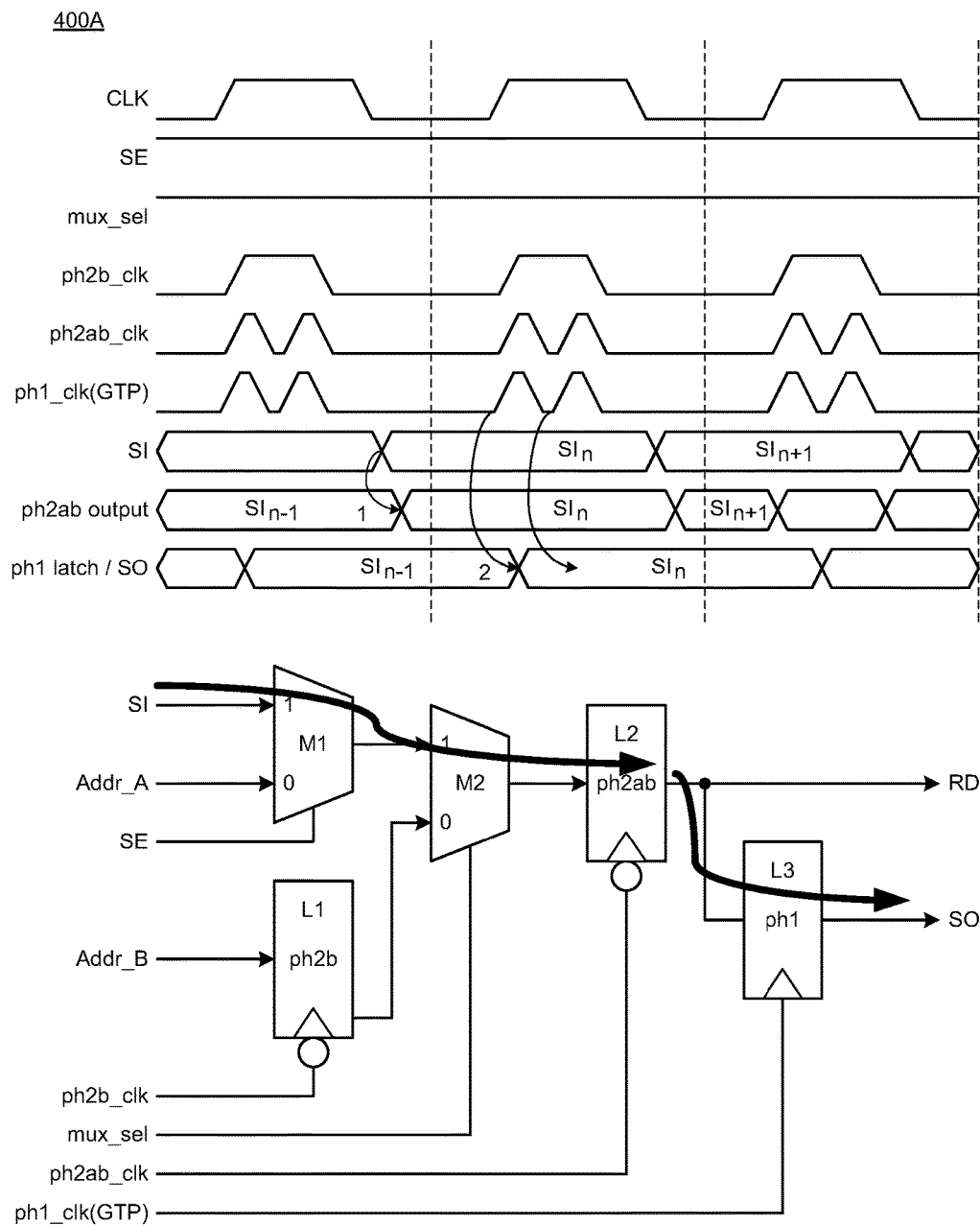
FIGS. 4A-4C illustrate various diagrams of timing sequences for implementing double pump memory circuitry in accordance with implementations described herein.
Figure 4B:
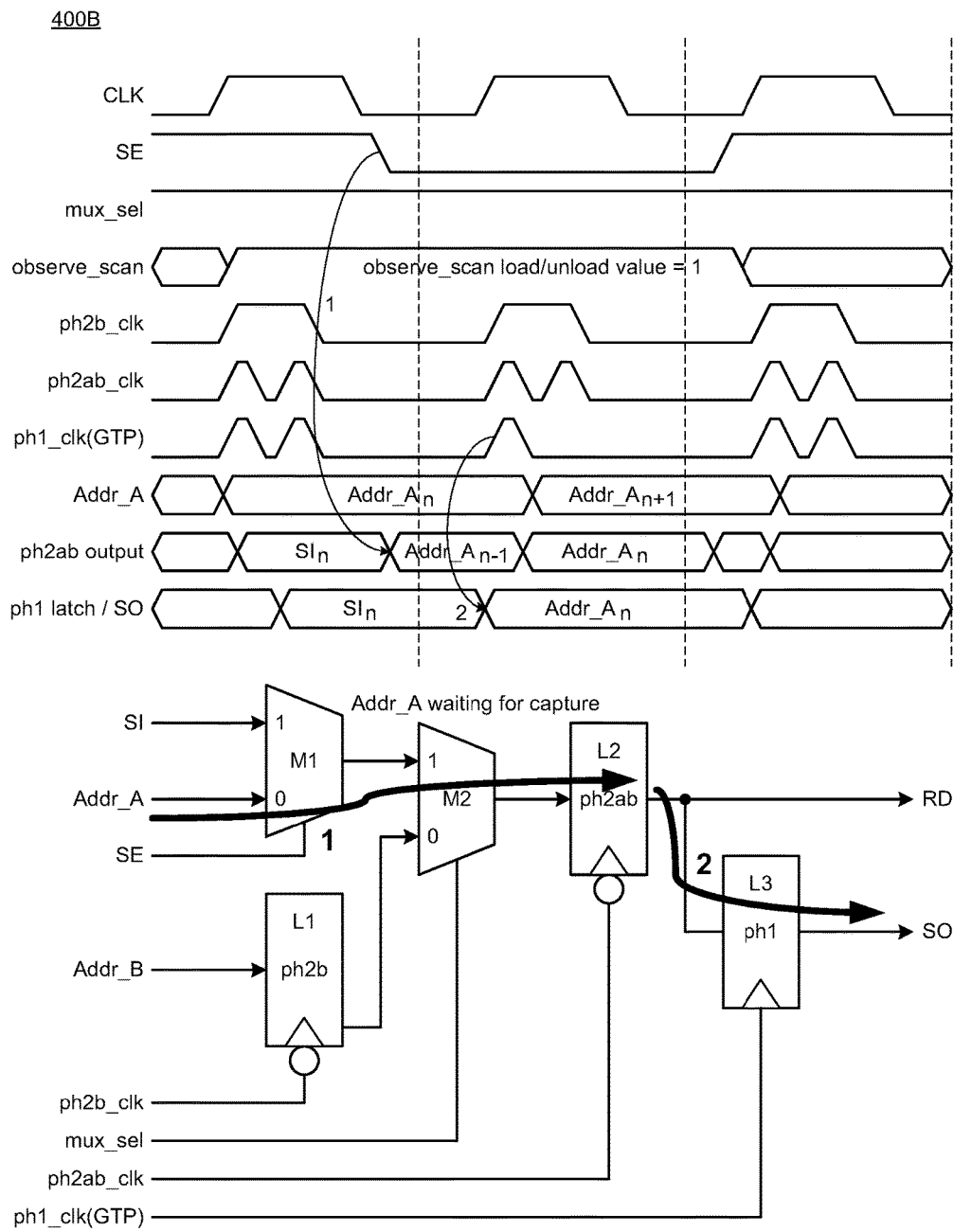
Figure 4C:
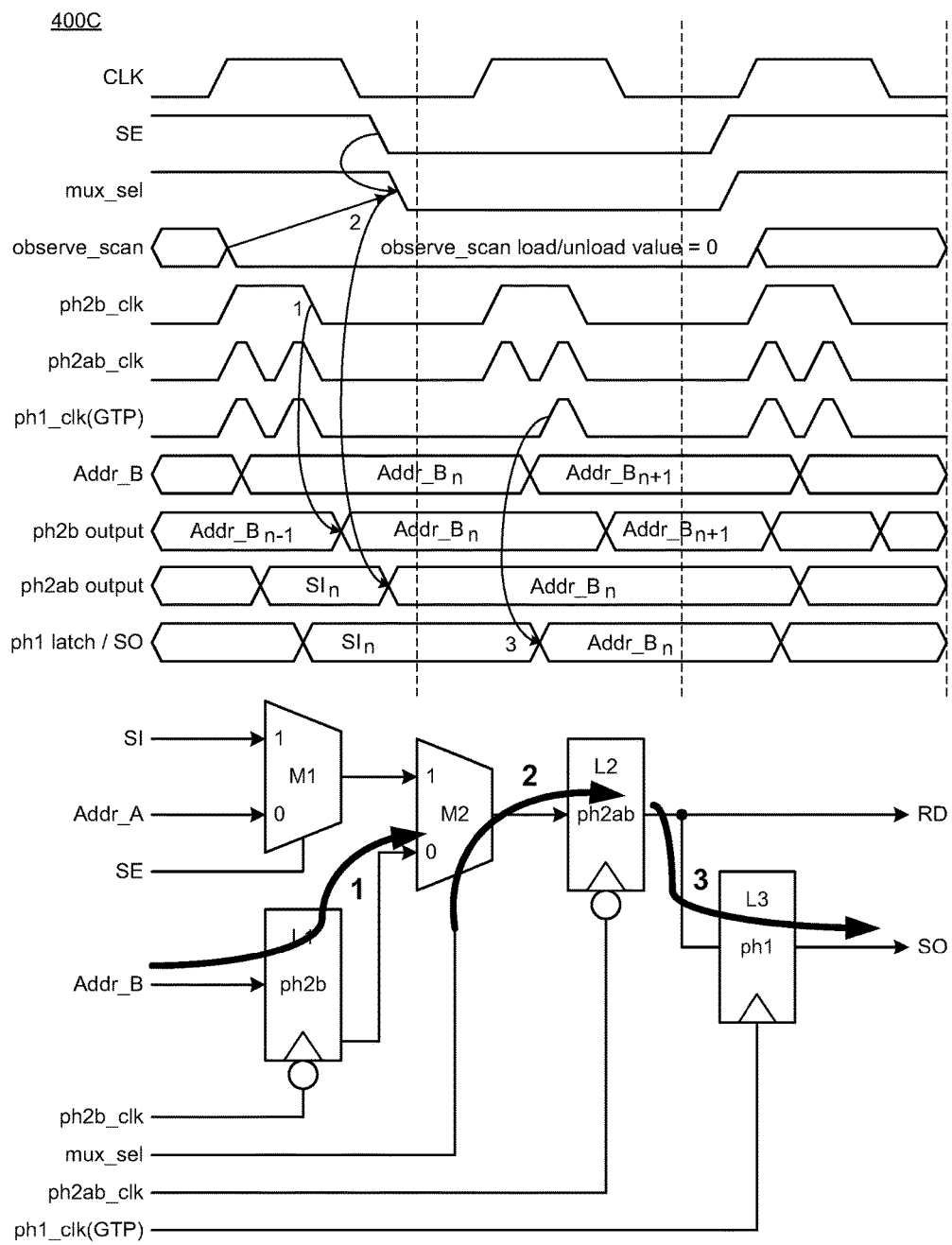

FIGS. 4A-4C illustrate various diagrams of timing sequences for implementing double pump memory circuitry in accordance with implementations described herein.

In particular, FIG. 4A illustrates a timing sequence diagram 400A for a scan shift to test load/unload of the circuitry 200 in FIG. 2. In FIG. 4A, a scan shift sequence for SI is shown, wherein observe_control is set to logic one (1). Note that the scan out (SO) path is double pumped through the ph1 latch. This is not of concern as the ph2ab latch output is stable for both pulses. Further, during scan shifting, timing and other functional behaviors are not being matched.

FIG. 4B illustrates a timing sequence diagram 400B for a scan capture of Addr_A with the circuitry 200 in FIG. 2. In FIG. 4B, a scan capture of Addr_A is shown as directed by the observe_control signal, which is set to logic one (1). Note that Addr_A is delivered when SE goes low as indicated by logic one (1). Further, the ph1_clk may then capture this observed value into the scan latch as shown in FIG. 4B with the second pump numeral 2. When observe_control is set to logic one (1) during functional capture clock, the second ph1_clk pulse is suppressed.

FIG. 4C illustrates a timing sequence diagram 400C for a scan capture of Addr_B with the circuitry 200 in FIG. 2. In FIG. 4C, a scan capture of Addr_B is shown as directed by the observe_control signal, which is set to logic zero (0). Note that the ph2b_clk goes low after the last scan shift allowing Addr_B to propagate. Note that SE goes low, allowing mux_sel to follow the observe_control value which is low. Note that only the second ph1_clk pulse fires, with the first ph1_clk pulse being suppressed by the observe_control value being low.

In various implementations, the schemes and/or techniques described herein provide for scan observation in a double pumped memory applications. For instance, the circuits described herein may use only one ph1 latch to save area. The circuits described herein may override mux_sel to choose the SI path during scan shift (during load/unload of test vectors) via the SE (scan enable) signal. The circuits described herein may use the observe_control signal during scan capture to select Addr_A or Addr_B. The circuits described herein may be controlled from a flop added to the internal scan chain as shown in FIG. 3. The circuits described herein may use an internal control flop that may be set by the ATPG tool to select a desired address path during a scan capture cycle (where loaded test vectors are executed). The circuits described herein may use an embedded flop that is transparent to the user/designer. The circuits described herein may use tools that may be leveraged as needed to obtain test coverages. The circuits described herein may use a hold flop that takes its timing out of design concern. The circuits described herein may use the ph1 latch clock that is controlled by the observe_control signal during scan capture. If Addr_B is observed, then deliver ph1 second pulse only. If Addr_A is observed, then deliver the first ph1 pulse only. This may result with each Addr_A/B path being tested with ph2 latches matching functional timing requirements, such as, e.g., hold timing for each port may be properly tested.

In various implementations, the schemes and techniques described herein utilize latching address signals. However, it should be appreciated by those skilled in the art that the various schemes and techniques described herein may be extended to non-address signals as well.

Figure 5:
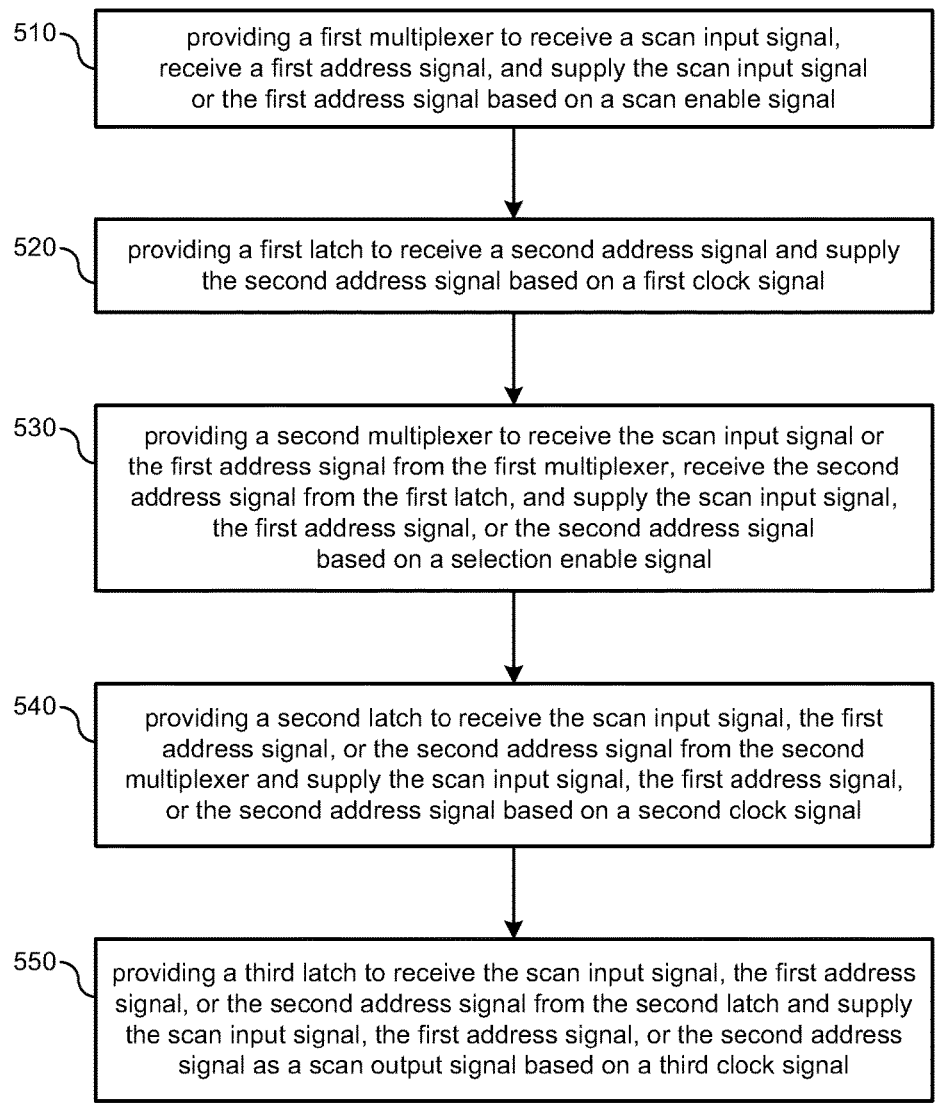
FIG. 5 illustrates a process flow diagram of a method for implementing a scan cell in dual port memory in accordance with implementations described herein.

FIG. 5 illustrates a process flow diagram of a method 500 for implementing a scan cell in dual port memory in accordance with implementations described herein.

It should be understood that even though method 500 may indicate a particular order of operation execution, in some cases, various certain portions of the operations may be executed in a different order, and on different systems. In some other cases, additional operations and/or steps may be added to and/or omitted from method 500. Further, method 500 may be implemented in hardware and/or software. If implemented in hardware, the method 500 may be implemented with various circuit components, such as described herein above in reference to FIGS. 1-4C. If implemented in software, the method 500 may be implemented as a program or software instruction process that may be configured for implementing a scan cell in dual port memory applications as described herein. Further, if implemented in software, various instructions related to implementing the method 500 may be stored or recorded in various types of memory. For instance, a computer, a server, or various other types of computing devices having a processor and memory may be configured to perform the method 500.

In reference to FIG. 5, method 500 may be used for implementing a scan cell in dual port memory. In some implementations, at block 510, method 500 may provide a first multiplexer to receive a scan input signal and receive a first address signal, and the first multiplexer may supply the scan input signal or the first address signal based on a scan enable signal. At block 520, method 500 may provide a first latch to receive a second address signal, and the first latch may supply the second address signal based on a first clock signal.

At block 530, method 500 may provide a second multiplexer to receive the scan input signal or the first address signal from the first multiplexer and receive the second address signal from the first latch, and the second multiplexer may supply the scan input signal, the first address signal, or the second address signal based on a selection enable signal. The scan enable signal may be different than the selection enable signal. The selection enable signal may include a multiplexer selection control signal.

At block 540, method 500 may provide a second latch to receive the scan input signal, the first address signal, or the second address signal from the second multiplexer, and the second latch may supply the scan input signal, the first address signal, or the second address signal based on a second clock signal. The second clock signal may be different than the first clock signal.

At block 550, method 500 may provide a third latch to receive the scan input signal, the first address signal, or the second address signal from the second latch, and the third latch may supply the scan input signal, the first address signal, or the second address signal as a scan output signal based on a third clock signal. The third clock signal may be different than the first and second clock signals.

Described herein are various implementations of a scan cell. The scan cell may include an input phase having multiple multiplexers and a latch arranged to receive a scan input signal, a first address signal, and a second address signal and provide the scan input signal, the first address signal, or the second address signal based on a scan enable signal, a first clock signal, and a selection enable signal. The scan cell may include an output phase having multiple latches arranged to receive the scan input signal, the first address signal, or the second address signal from the input phase and provide the scan input signal, the first address signal, or the second address signal as a scan output signal based on a second clock signal and a third clock signal.

Described herein are various implementations of an integrated circuit. The integrated circuit may include a first multiplexer that receives a scan input signal, receives a first address signal, and provides the scan input signal or the first address signal based on a scan enable signal. The integrated circuit may include a first latch that receives a second address signal and provides the second address signal based on a first clock signal. The integrated circuit may include a second multiplexer that receives the scan input signal or the first address signal from the first multiplexer, receives the second address signal from the first latch, and provides the scan input signal, the first address signal, or the second address signal based on a selection enable signal. The integrated circuit may include a second latch that receives the scan input signal, the first address signal, or the second address signal from the second multiplexer and provides the scan input signal, the first address signal, or the second address signal based on a second clock signal. The integrated circuit may include a third latch that receives the scan input signal, the first address signal, or the second address signal from the second latch and provides the scan input signal, the first address signal, or the second address signal as a scan output signal based on a third clock signal.

Described herein are various implementations of a method. The method may include providing a first multiplexer to receive a scan input signal, receive a first address signal, and supply the scan input signal or the first address signal based on a scan enable signal. The method may include providing a first latch to receive a second address signal and supply the second address signal based on a first clock signal. The method may include providing a second multiplexer to receive the scan input signal or the first address signal from the first multiplexer, receive the second address signal from the first latch, and supply the scan input signal, the first address signal, or the second address signal based on a selection enable signal. The method may include providing a second latch to receive the scan input signal, the first address signal, or the second address signal from the second multiplexer and supply the scan input signal, the first address signal, or the second address signal based on a second clock signal. The method may include providing a third latch to receive the scan input signal, the first address signal, or the second address signal from the second latch and supply the scan input signal, the first address signal, or the second address signal as a scan output signal based on a third clock signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A scan cell, comprising:
an input phase having first and second multiplexers arranged in series, the input phase having first latch coupled to the second multiplexer, wherein the first multiplexer is configured to provide a scan input signal or a first address signal to the second multiplexer based on a scan enable signal, and wherein the second multiplexer is configured to receive a second address signal from the first latch based on a first clock signal and to provide the scan input signal, the first address signal, or the second address signal based on a selection enable signal; and
an output phase having second and third latches, wherein the third latch is configured to obtain an output signal from the second latch, wherein the second latch is configured to receive the scan input signal, the first address signal, or the second address signal from the input phase and provide the scan input signal, the first address signal, or the second address signal to the third latch as the output signal based on a second clock signal, and wherein the third latch is configured to provide the scan input signal, the first address signal, and the second address signal as a scan output signal based on a third clock signal, wherein at least one of the second clock signal and the third clock signal is a double pumped clock signal.

2. The scan cell of claim 1, wherein the first multiplexer receives the scan input signal, receives the first address signal, and provides the scan input signal or the first address signal to the second multiplexer based on the scan enable signal.

3. The scan cell of claim 2, wherein the first latch receives the second address signal and provides the second address signal to the second multiplexer based on the first clock signal.

4. The scan cell of claim 3, wherein the second multiplexer receives the scan input signal or the first address signal from the first multiplexer, receives the second address signal from the first latch, and provides the scan input signal, the first address signal, or the second address signal to the output phase based on the selection enable signal.

5. The scan cell of claim 4, wherein the second latch receives the scan input signal, the first address signal, or the second address signal from the second multiplexer and provides the scan input signal, the first address signal, or the second address signal to the third latch based on the second clock signal.

6. The scan cell of claim 5, wherein the third latch receives the scan input signal, the first address signal, or the second address signal from the second latch and provides the scan input signal, the first address signal, or the second address signal as the scan output signal based on the third clock signal.

7. The scan cell of claim 1, wherein the first address signal references a first port memory address from a dual port memory component, and wherein the second address signal references a second port memory address from the dual port memory component.

8. The scan cell of claim 7, wherein the selection enable signal comprises an observe control signal that is used during a scan capture mode of operation of the scan cell to select the first port memory address or the second port memory address.

9. The scan cell of claim 1, wherein the first clock signal is different than the second clock signal.

10. The scan cell of claim 1, wherein the third clock signal is different than the first clock signal.

11. The scan cell of claim 1, wherein the scan enable signal is different than the selection enable signal.

12. The scan cell of claim 1, wherein the selection enable signal includes a multiplexer selection control signal.

13. An integrated circuit, comprising:
a first multiplexer that receives a scan input signal, receives a first address signal, and provides the scan input signal or the first address signal based on a scan enable signal;
a first latch that receives a second address signal and provides the second address signal based on a first clock signal;
a second multiplexer that receives the scan input signal or the first address signal from the first multiplexer, receives the second address signal from the first latch, and provides the scan input signal, the first address signal, or the second address signal based on a selection enable signal;
a second latch that receives the scan input signal, the first address signal, or the second address signal from the second multiplexer and provides the scan input signal, the first address signal, or the second address signal based on a second clock signal; and
a third latch that receives the scan input signal, the first address signal, or the second address signal from the second latch and provides the scan input signal, the first address signal, or the second address signal as a scan output signal based on a third clock signal, wherein
at least one of the second clock signal and the third clock signal is a double pumped clock signal.

14. The integrated circuit of claim 13, wherein the scan enable signal is different than the selection enable signal.

15. The integrated circuit of claim 13, wherein the selection enable signal includes a multiplexer selection control signal.

16. A method, comprising:
providing a first multiplexer to receive a scan input signal, receive a first address signal, and supply the scan input signal or the first address signal based on a scan enable signal;
providing a first latch to receive a second address signal and supply the second address signal based on a first clock signal;
providing a second multiplexer to receive the scan input signal or the first address signal from the first multiplexer, receive the second address signal from the first latch, and supply the scan input signal, the first address signal, or the second address signal based on a selection enable signal;
providing a second latch to receive the scan input signal, the first address signal, or the second address signal from the second multiplexer and supply the scan input signal, the first address signal, or the second address signal based on a second clock signal; and
providing a third latch to receive the scan input signal, the first address signal, or the second address signal from the second latch and supply the scan input signal, the first address signal, or the second address signal as a scan output signal based on a third clock signal, wherein
at least one of the second clock signal and the third clock signal is a double pumped clock signal.

17. The method of claim 16, wherein the second clock signal is different than the first and third clock signals.

18. The method of claim 16, wherein the scan enable signal is different than the selection enable signal, and wherein the selection enable signal includes a multiplexer selection control signal.

* * * * *